United States Patent

Seibert et al.

[11] Patent Number: 5,999,254
[45] Date of Patent: Dec. 7, 1999

[54] SUPPORTING PLATE FOR A PHOTOMASK IN AN APPARATUS FOR MAKING A MICROCHIP

[75] Inventors: Volker Seibert, Ober-Olm; Ulf Schniering, Stadecken; Konrad Knapp, Mainz, all of Germany

[73] Assignee: Schott Glas, Mainz, Germany

[21] Appl. No.: 09/215,005

[22] Filed: Dec. 17, 1998

[30] Foreign Application Priority Data

Dec. 18, 1997 [DE] Germany .......................... 197 56 486

[51] Int. Cl.⁶ .................................................. G01N 21/01
[52] U.S. Cl. ............................................................ 356/244
[58] Field of Search .................................... 356/244, 246, 356/399–401, 440; 378/34, 35; 430/5

[56] References Cited

U.S. PATENT DOCUMENTS 5,101,420  3/1992  Kushibiki et al. ........................ 378/35

FOREIGN PATENT DOCUMENTS 88 00 272 U  4/1998  Germany .

*Primary Examiner*—Hoa Q. Pham
*Attorney, Agent, or Firm*—Michael J. Striker

[57] ABSTRACT

An apparatus is used to make microchips in which monochromatic light issuing from a light source is guided to a photomask that is held in a predetermined position in which the monochromatic light rays are combined with a lens system and directed to a wafer. The supporting plate is a rectangular plate made from glass or glass-ceramic material that has a receptacle for holding the photomask. In order to provide a supporting plate according to the invention with weight that is as small as possible and with a dynamic stiffness as high as possible, the rectangular plate is provided with front-edge elongated blind holes extending in side edge regions along both long edges of the rectangular plate in the plane of the plate, as well as with other recesses. The elongated blind holes are preferably thin-walled and have a box-like shape.

6 Claims, 4 Drawing Sheets

SUPPORTING PLATE FOR A PHOTOMASK IN AN APPARATUS FOR MAKING A MICROCHIP

BACKGROUND OF THE INVENTION

1. Field of the Invention

The present invention relates to a supporting plate for a photomask in an apparatus for making a microchip, comprising a rectangular plate made from glass or glass-ceramic material, which is provided with a receptacle in the plate upper side for holding the photomask in operation in an accurate position and/or which has a plurality of recesses in the plate lower side for weight reduction and at the same time for increasing the stiffness of the supporting plate.

2. Prior Art

An apparatus for microchip manufacture according to the state of the art is shown in FIG. 3A Monochromatic light issues from an unshown light source. The beam is guided by two mirror surfaces 2a and 2b to a photomask 3, which is held by a supporting plate 10 in a predetermined position, which comprises a rectangular plate 4 made from glass or glass-ceramic material . A prior art or conventional supporting plate 10 used in the apparatus of FIG. 3A is shown in FIGS. 3b and 3c. The supporting plate 10 is the subject of the p resent invention.

The monochromatic light rays are combined by a lens system 5 and form a predetermined conductor strip structure on a wafer 6 mounted on the wafer plate 7 by means of the photomask 3, which is later etched away in a later etching process. A number of the same type of integrated circuits are produced in the wafer 6 which acts as substrate, which are separated to form the semiconductor microchip after testing their operability.

As shown in FIGS. 3b and 3c the photomask 3 is received in a circular receptacle 8 and is held in this position by low pressure or vacuum. According to the state of the art the photomasks 3 typically have a size of 6 inches (square shape with an edge length of about 152 mm, thickness of about 9 mm). The size of the photomask is directly related to the size of the receptacle 8; at the corners the spacing a of the photomask 3 from the inner side of the receptacle 8 must amount to at least 10 mm.

The photomask can be held in a metal support with a suitable central opening according to the disclosure in German Patent Document DE 88 00 272 U1. By means of this type of support it is possible to accurately position the photomask in a simple manner in the receptacle or hole in the supporting plate with the help of centering pins and a locking device and to perform the work through the central opening. Because of that an automatic guidance of the photomask in the supporting plate is not only possible, but also an automatic and simple manipulation of the support with the photomask between individual stations is possible. The support has triangular recesses formed in the corner regions for weight reduction without damaging stiffness.

During the exposure of the wafer 6 motions of the supporting plate 10 for the photomask 3 and also the wafer plate 7 are performed. The supporting plate 10 of the photomask is guided so that its motions are exclusively in the X-direction, while the wafer plate 7 moves in the X-direction and Y-direction.

In the embodiment according to the state of the art acceleration of the supporting plate for the photomask 3 is on the order of 3 g (about 30 m/sec$^2$). Two fundamental requirements for the structure of the supporting plate 10 for the photomask 3 result because of the acceleration amplitudes. There must be a reduction or minimization of the mass moved, on the one hand, and, on the other hand, an increase in the dynamic stiffness. Eigenvibrations of the system that produce structural errors in the wafer are excited by the acceleration amplitudes.

During the exposure of the wafer 6 the motions of the supporting plate 10 for the photomask 3 are monitored and the position deviations are compensated by adjusting elements. There are three actuators for the Z-coordinate, which are located in the recesses 9a, 9b and 9c of the supporting plate 10. A Lorentz motor 100 is provided for compensation in the X-direction, which is attached to the front edge fe of the supporting plate 10, and of course on the edge on which the recesses 9a and 9b for two Z-actuators are provided.

An interferometer mirror on one of the long side surfaces provides a measure for the positioning variable for the supporting table for the photomask.

For example, if a supporting plate for a photomask has dimensions of 560×450×66 mm and is made from a block (e.g. the glass material Zerodur®, with a density of 250 kg/m$^3$), except for the holes for the photomask and the Z-actuators, it has a total mass of about 30 kg. The requirements regarding mass for a suitable acceleration however require a mass between 10 and 14 kg.

Pockets 11 are cut from the complete material according to the state of the art. One possible embodiment is shown in FIGS. 4A and 4b. In FIG. 4a a top view of the prior art supporting plate 10 with the recesses 8 for receiving the photomask 3 is shown, with a series of pockets 11 and 11' which are formed as blind holes that are produced in both long sides ls of the supporting plate.

In FIG. 4b a bottom view of the prior art supporting plate 10 is shown, with pockets 11" in the form of blind holes, which are distributed according to the stiffness view point. The form of the pockets can be rectangular, honeycomb-shaped or triangular. To increase the stiffness of the supporting plate each pocket can be provided with an undercut. The working direction is limited to the thickness direction (similar to the holes for the Z-actuators). The minimum wall thickness is in the range of from 4 to 5 mm. Smaller wall thickness cannot be obtained with conventional cutting operations because of the cutting forces and the brittleness of the glass or glass-ceramic material. The supporting plate for a 6-inch photomask can be made with a mass of about 14 kg with these steps.

It is of special importance for operations that the dynamic stiffness is sufficiently high so that undesirable vibrations do not occur during the exposure process.

Manufacturers of apparatus for microchip manufacture require a frequency of at least 500 Hz for the bending vibration of the total system.

The eigenfrequencies obtained with the prior art structure are on the order of about 450 Hz for bending. These values are for a glass block without added structures (e.g. Z-motor, Lorentz motor) in free-free position.

Changes of the pocket size in both edge regions of the supporting plate for the photomask have shown that a significant increase in the dynamic stiffness it is not possible. The bending eigenfrequencies are in a range between 700±30 Hz. Comparable experimental vibration experiments have shown that a very good correlation between calculated and measured variables is produced.

A change in the pocket position, as experiments have shown, leads to no noteworthy increase in the dynamic stiffness.

The known construction measures for weight reduction and stiffening of the supporting plate for the photomask limit the dimensions of the supporting plate so that according to the state of the art it is only possible to make a supporting plate for a 6 inch photomask.

SUMMARY OF THE INVENTION

It is an object of the present invention to provide a supporting plate of the above-described type for holding a photomask in an apparatus for making microchips that does not have the above-described disadvantages.

It is another object of the present invention to provide a supporting plate of the above-described type for holding a photomask, whose stiffness is increased while its mass is simultaneously reduced in comparison to the stiffness and mass of the prior art supporting plates.

This object and others which will be made more apparent hereinafter are attained in a supporting plate for a photomask comprising a rectangular plate made of glass or glass-ceramic material, wherein the rectangular plate is provided with a receptacle for receiving the photomask to accurately position the photomask during operation of the apparatus for making the microchips and with recesses in its top side and/or bottom side for weight reduction and at the same time for stiffening the rectangular plate.

According to the invention these recesses include elongated blind holes provided in the front edge of the rectangular plate. The blind holes extend in the plane of the rectangular plate in respective side edge regions along both long sides of the rectangular plate.

Because of the features of the invention it is possible to provide a correspondingly larger supporting plate for a 9-inch photomask, whose mass is nevertheless in the required range between 10 and 14 kg. In the case of a 9-inch photomask the edge length of the supporting plate amounts to about 229 mm. The dynamic stiffness is so high that the susceptibility to vibration in transient excitation is greatly reduced. The 9-inch photomask allows more microchips to be exposed on the wafer at the same time in the working process, whereby the productivity of the manufacturing method for the microchips is increased. The supporting plate is however dynamically stiff enough so that it can be accelerated or moved with an acceleration of about 5 g (about 50 m/sec$^2$) and greater, without the susceptibility to oscillations exceeding a certain amount. The productivity of the microchip manufacturing method is similarly increased because of this higher acceleration value.

The fact that elongated blind holes in glass can be formed with standard manufacturing techniques is an additional advantage. Cost intensive special processes can then be avoided.

A reduction of the weight to up to 10 kg and an increase in the dynamic stiffness can be achieved according to the invention by the elongated blind holes formed according to the invention, especially when they are formed according to a preferred embodiment in which the elongated blind holes are in the form of thin-walled openings with a rectangular cross-section, i.e. with a box-like shape, and which has the conventional triangular recesses, with otherwise unchanged dimensions (length, width and height).

Supporting plates of the above-described kind have a motor for the Z-component motion of the supporting plate. According to a further embodiment of the invention the motor is integrated in the supporting plate. Because of this feature the free bending length is reduced or the bending frequency increased.

According to another embodiment of the invention stiffening or reinforcing ribs are provided on the side edge regions of the upper side of the supporting plate, in which the elongated holes are formed, i.e. especially over the sides of the blind holes. These stiffening ribs can be glued or can be applied to the finely polished surfaces by simple adhesion. The size of the ribs is determined by spatial considerations for the particular embodiment. The stiffening ribs applied on the supporting plate provide a beneficial increase in bending frequencies.

According to an additional embodiment of the invention the stiffening ribs are off-center or arranged eccentrically. Because of this feature displacement of the center of mass by the Lorentz motor suspended from the supporting plate can be compensated to a certain extent.

BRIEF DESCRIPTION OF THE DRAWING

The objects, features and advantages of the invention will now be illustrated in more detail with the aid of the following description of the preferred embodiments, with references to the accompanying figures in which.

DESCRIPTION OF THE PREFERRED EMBODIMENT

Figure 1A:
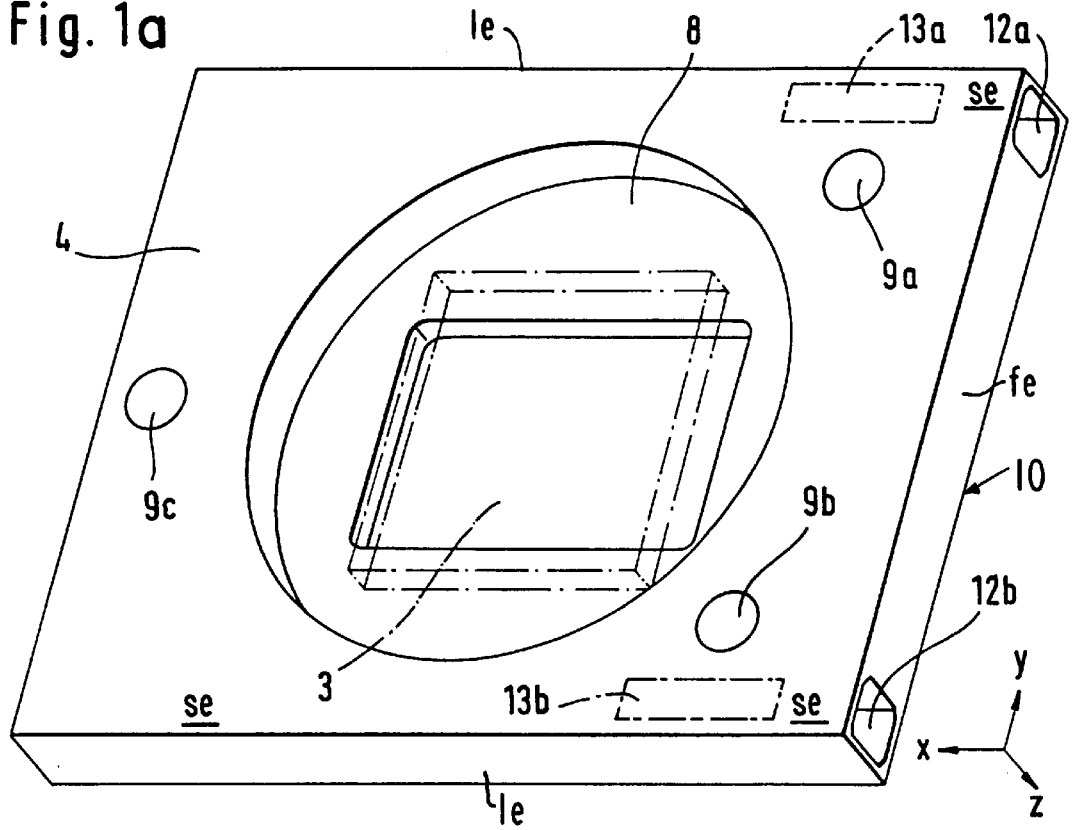
FIG. 1*a* is a perspective view of a supporting plate for a photomask according to the invention.
Figure 1B:
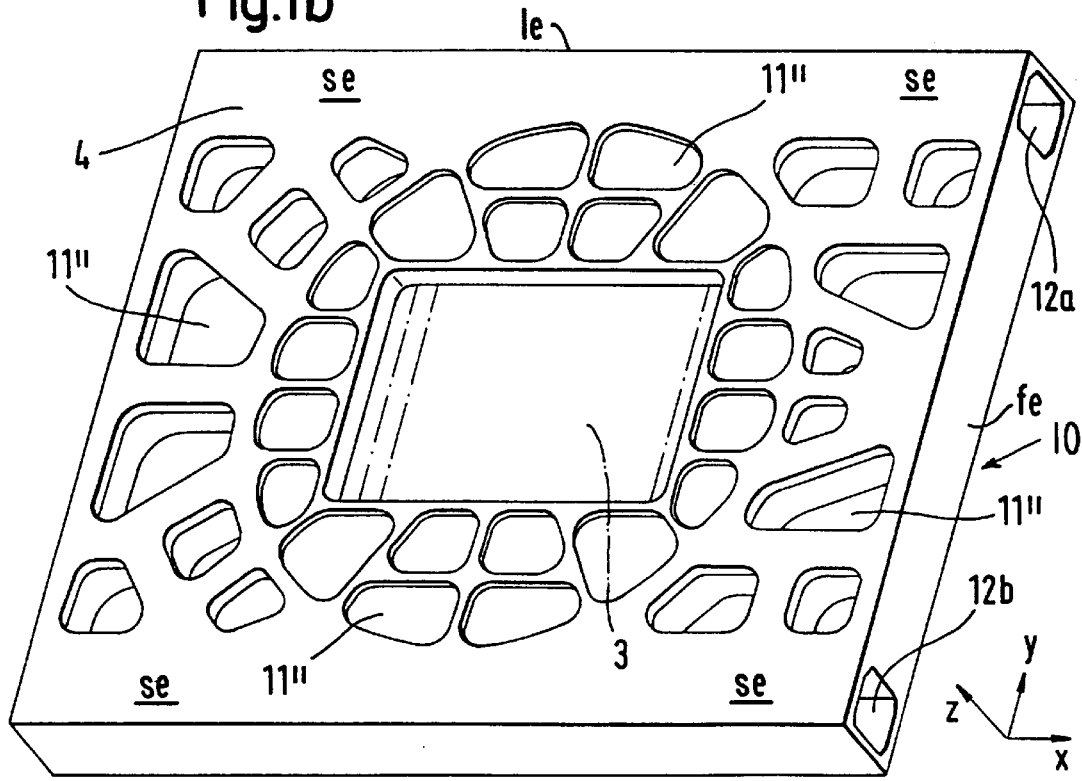
FIG. 1*b* is a perspective view of the bottom side of the supporting plate shown in FIG. 1*a* from below.
Figure 3A:
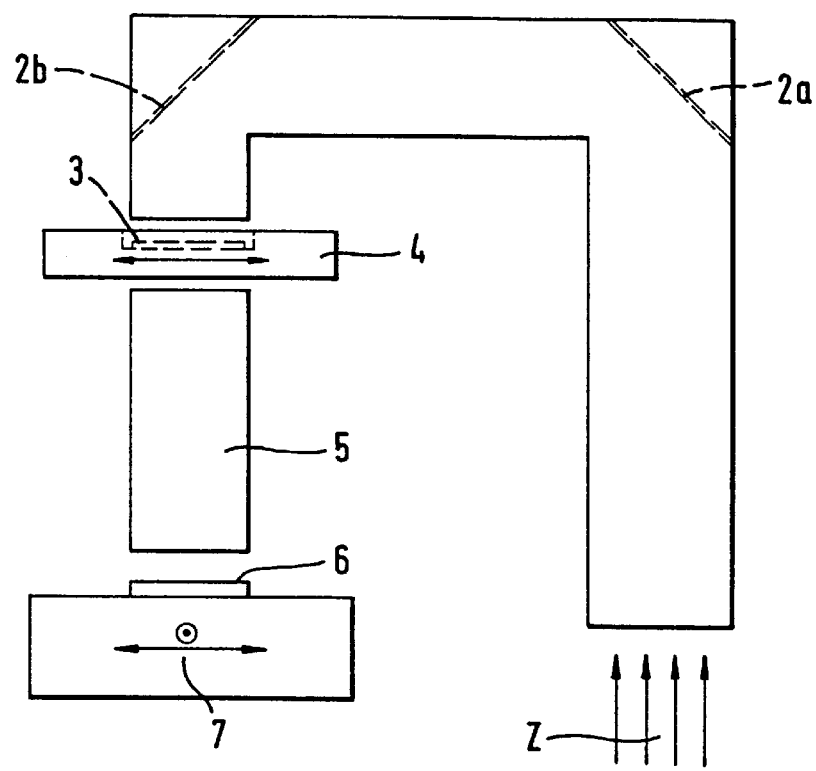
FIG. 3*a* is a diagrammatic side view of an entire known apparatus for making a microchip.
Figure 3B:
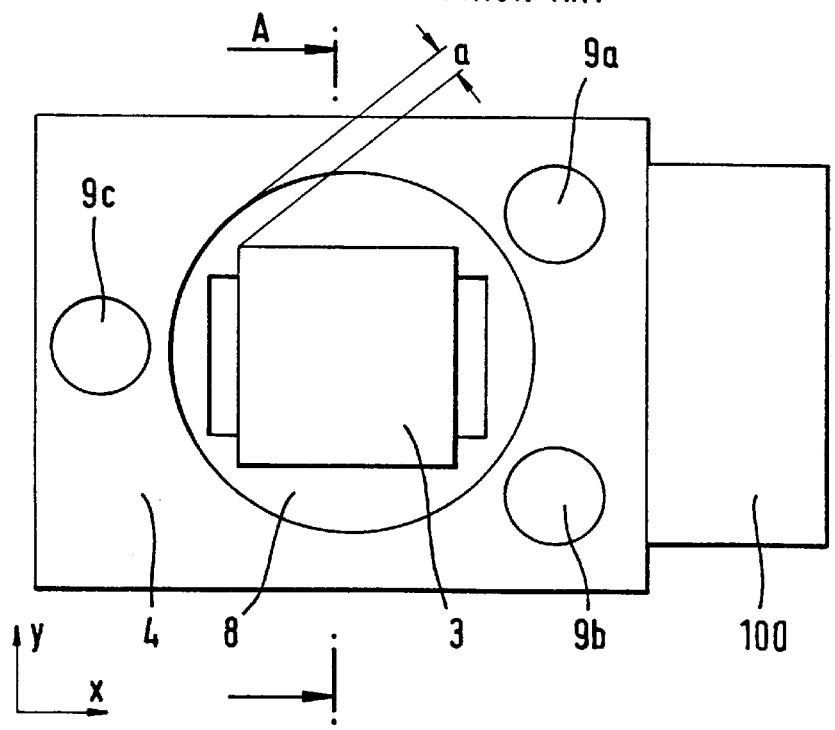
FIGS. 3*b* and 3*c* are, respectively, a plan view and a side cross-sectional view of the supporting plate of the prior art for a photomask, the latter taken along the section line A–B in FIG. 3*a*.
Figure 3C:
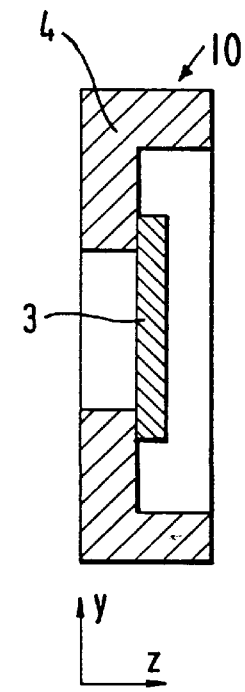
Figure 4A:
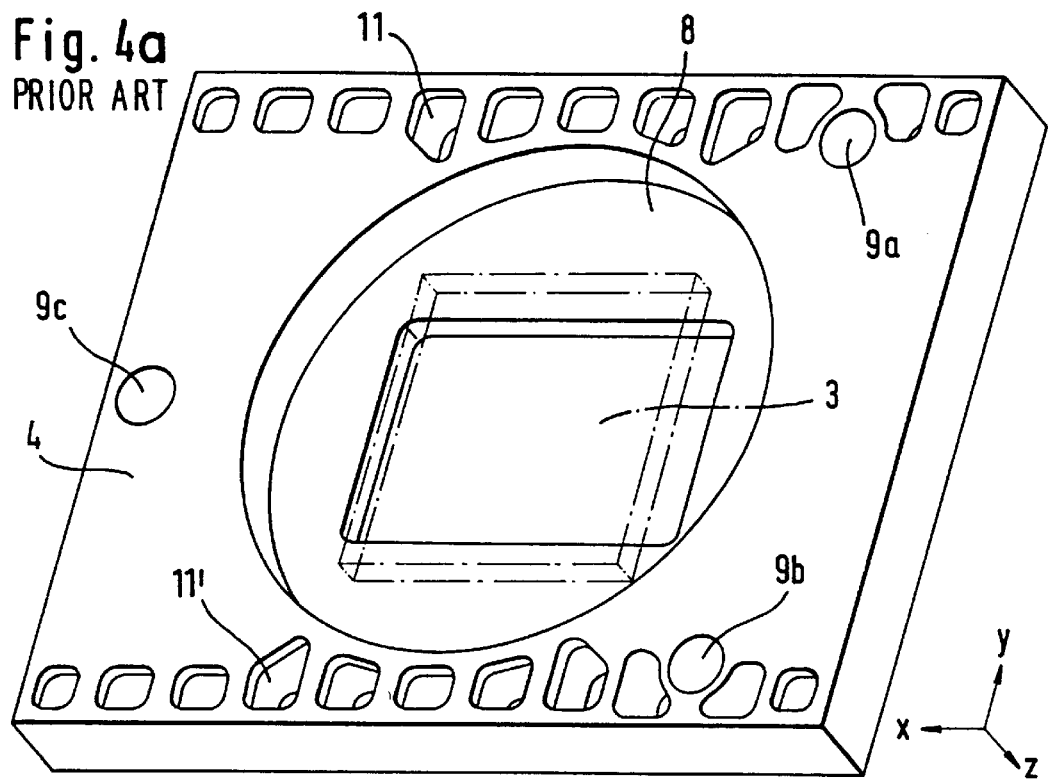
FIG. 4*a* is a perspective view of the top side of a supporting plate for a photomask of the prior art.

FIGS. 1*a* and 1*b* show a preferred embodiment of the supporting plate 10 for a photomask 3 according to the invention for an apparatus for making a microchip as shown in FIG. 3*a* FIG. 1*a* shows a view of the top side of the supporting plate in a manner similar to FIG. 4*a* for the known supporting plate. The supporting plate 10 comprises a rectangular plate 4 made of glass or glass-ceramic material with the central receptacle 8 for accurately positioning the photomask 3. Furthermore throughgoing holes 9*a* to 9*c* for the actuators for the Z-direction are also provided in the rectangular plate 4 of FIG. 1*a* and 1*b* as they are in the prior art rectangular plate 4 of FIG. 4*a* and 4*b*.

Figure 4B:
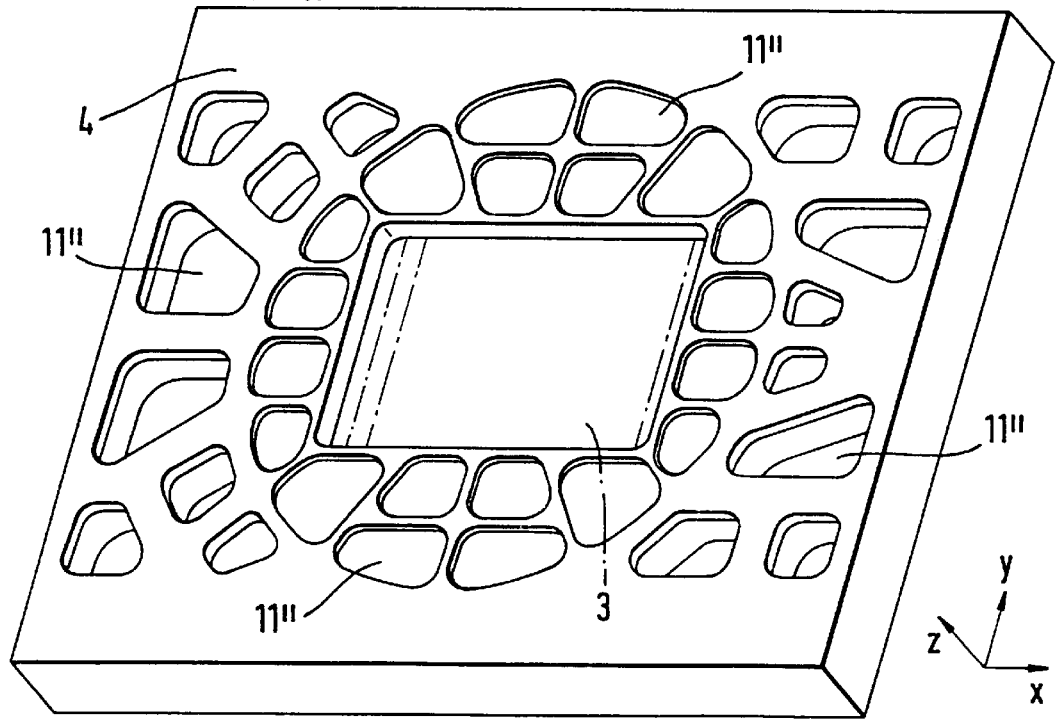
FIG. 4*b* is a perspective view of the bottom side of the known supporting plate shown in FIG. 4*a*.

A perspective view of the bottom side of the supporting plate 10 according to the invention is shown in FIG. 1*b* and corresponds to the view of the prior art supporting plate shown in FIG. 4*b*. Pocket-like recesses 11" are formed in the bottom side of the rectangular plate 4 of FIG. 1*b* which are similar to those of FIG. 4*b*. The geometry of the pocket-like recesses 11" is similar to the geometry of the pocket-like recesses 11" in the case of the known supporting plate 10.

The distribution of the pocket-like recesses 11" shown in FIG. 1*b* is only an exemplary distribution. The pocket-like recesses 11" can have other configurations and/or other distributions, which are determined to obtain the optimum stiffness. It is also conceivable to provide the pocket-like recesses 11" in the top side as well as the bottom side of the rectangular plate, although this is not shown in the drawing.

The main difference between the embodiment according to the invention shown in FIG. 1a and FIG. 1 II and the known embodiment according to FIGS. 4a and 4b is that the pocket-like recesses 11" provided in the side edge regions se of the long sides ls of the known rectangular plate 4 are replaced by the elongated blind holes 12a and 12b in the front edge fe of the rectangular plate 4, which extend in the plane of the plate. The front-edge elongated blind holes 12a and 12b preferably are thin-walled holes with a box-like or rectangular parallelepiped shape, i.e. with a substantially rectangular cross-section. Stiffening ribs 13a and 13b are provided on the respective side edge regions se along the long edges le in which the elongated blind holes 12a and 12b extend for improvement of the stiffness and for increasing the vibration frequencies. Preferably the stiffening ribs, are arranged eccentrically as shown in the drawing, so that the center of gravity can be influenced, which is indeed also effected by the Lorentz motor 10 shown in FIG. 3a.

Figure 2A:
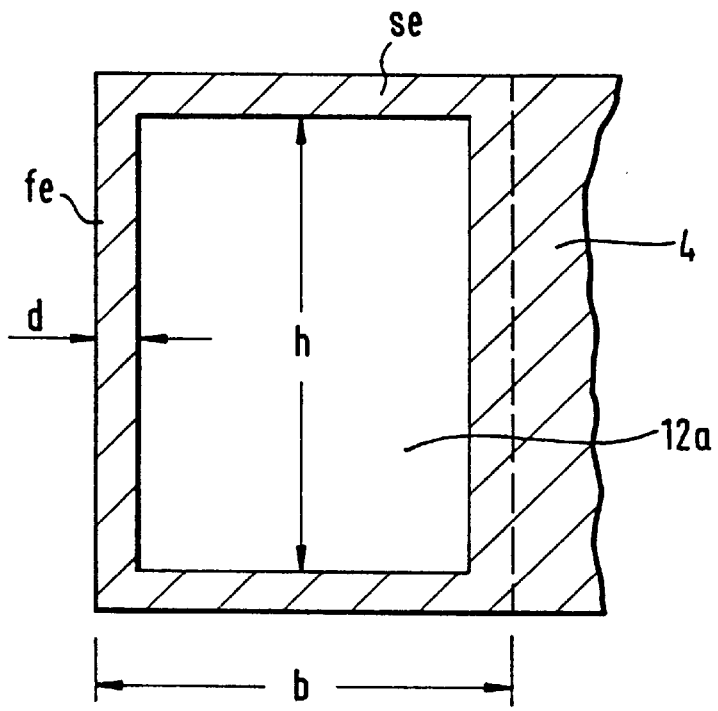
FIG. 2*a* is an idealized schematic cross-sectional view of a preferred embodiment of an elongated hole in the supporting plate according to the invention.
Figure 2B:
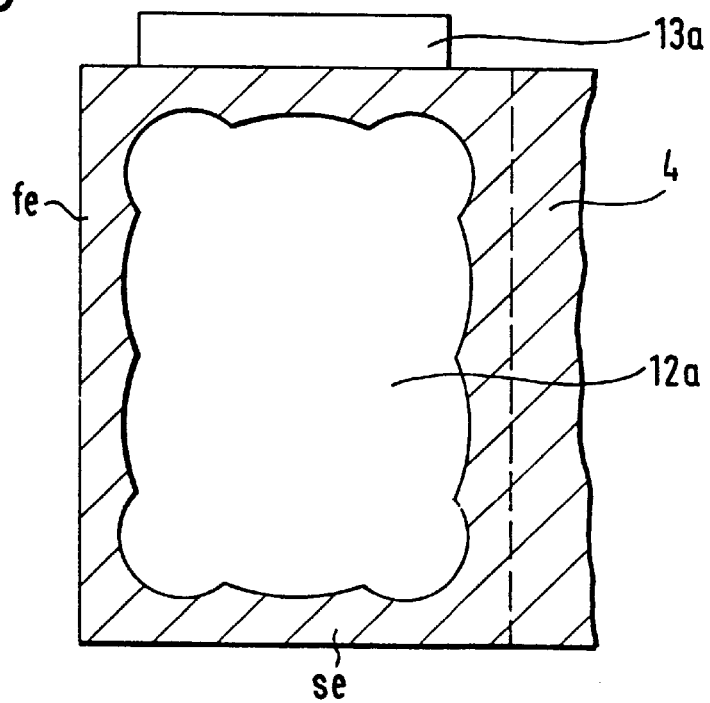
FIG. 2*b* is an actual cross-sectional view the elongated hole of FIG. 2*a* formed by multiple drilling processes.

A preferred cross-section for the elongated blind holes 12a and 12b is shown in FIGS. 2a and 2b. An idealized structure with a weight saving of 67% is shown in FIG. 2a. An actual structure drilled with drills of different diameters is shown in FIG. 2b with a weight saving of 63%. The minimum wall thickness "d" in the elongated holes should be in the range of from 4 to 5 mm, similar to the wall thickness for the pocket-like recesses, also on account of variations of the drilling from the ideal boundaries of the holes. The lateral structures in the elongated blind holes have a greater influence on the bending stiffness, i.e. on the surface inertia for bending motion, than both surface elements above and below the blind holes. The quotient h/b (hole height h divided by hole width b including wall thickness on each side) provides a guide for construction to the shape of the elongated blind holes. A quotient of about 1.2 to 1.5 is optimum considering the outer dimensions for construction of the supporting plate. Thus the height of the elongated blind holes should be about 66 mm and the width should be about 50 mm for a supporting plate for a 9-inch photomask.

It is conceivable also to arrange the box-like shaped recesses transversely. This variation however has been shown by experiment to provide almost no advantages in regard to stiffness and weight saving in comparison to the prior art embodiment with the triangular pocket-like recesses.

FIG. 2b shows an additional advantage to the thin-walled box-like shape of the elongated blind holes 12a or 12b. It is apparent that substantially curved surfaces with large transitional radii result from the multiple drilling in the vicinity of the corner edges of the elongated holes. Because of that stress peaks are avoided in the supporting plate, which occurs with sharp edges or shoulders when an external load is applied.

An additional advantage results from making an interferometer mirror on a long-side surface that has not been illustrated in the drawing. Only the length of the supporting plate limits the length of the interferometer mirror. In the case of a 9-inch photomask the mirror length amounts to 556 mm with a tolerance for working of about 2 mm on both sides, so that a required length of about 560 mm results.

When different stiffness is produced along the long axis in the pocket structure of the known supporting plate according to FIGS. 4a and 4b, i.e. because of the recesses 11 and 11' along both sides, a reduction in the stiffness occurs in the vicinity of these recesses. During the required polishing of the lateral surfaces the regions with reduced stiffness experience higher elastic deformation than the regions of higher stiffness. During a release from load this leads to an elastic recoil and thus to oscillation along the longitudinal axis. However with the laterally-closed box-like shape of the holes according to the invention as shown in FIG. 1a the stiffness along the longitudinal axis and similarly along the Z-coordinate is constant and thus the elastic recoil after the polishing process is also constant. Thus no oscillation occurs in the case of the structure according to the invention in contrast to the prior art.

While the invention has been illustrated and described as embodied in a supporting plate for a photomask in an apparatus for making a microchip, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

We claim:

1. A supporting plate for a photomask in an apparatus for making a microchip, said supporting plate comprising a rectangular plate made of glass or glass-ceramic material;

wherein said rectangular plate has a top side, a bottom side and long edges, said rectangular plate is provided with a receptacle receiving said photomask to accurately position said photomask during operation of the apparatus for making the microchip and said rectangular plate is provided with a plurality of recesses in said top side and/or said bottom side for weight reduction and at the same time for stiffening the rectangular plate; and wherein said recesses include elongated blind holes provided in a front edge of the rectangular plate, said elongated blind holes are located in respective side edge regions along opposite long edges of the rectangular plate and said elongated blind holes extend in a plane passing through said rectangular plate.

2. The supporting plate as defined in claim 1, wherein each of the elongated blind holes has the shape of a rectangular parallelepiped.

3. The supporting plate as defined in claim 2, wherein each of the elongated blind holes is a thin-walled opening having a substantially rectangular cross-section.

4. The supporting plate as defined in claim 1, further comprising a motor integrated in the rectangular plate.

5. The supporting plate as defined in claim 1, further comprising stiffening ribs arranged on said side edge regions in which said elongated holes extend.

6. The supporting plate as defined in claim 5, wherein said stiffening ribs are arranged eccentrically on said rectangular plate.

* * * * *